United States Patent
Lee et al.

(10) Patent No.: US 8,135,974 B2
(45) Date of Patent: Mar. 13, 2012

(54) POWER ON CONTROL DEVICE AND METHOD

(75) Inventors: Sheng-Yuan Lee, Taipei (TW); Long-Tai Chen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 397 days.

(21) Appl. No.: 12/540,658

(22) Filed: Aug. 13, 2009

(65) Prior Publication Data

US 2010/0045347 A1 Feb. 25, 2010

(30) Foreign Application Priority Data

Aug. 21, 2008 (TW) .............................. 97132000 A

(51) Int. Cl.
- G06F 1/00 (2006.01)
- G06F 1/26 (2006.01)
- G06F 11/30 (2006.01)
- H02H 3/24 (2006.01)

(52) U.S. Cl. ............................ 713/340; 713/300; 361/90

(58) Field of Classification Search .................. 713/300, 713/340; 361/90
See application file for complete search history.

(56) References Cited

U.S. PATENT DOCUMENTS

| | | | | |
|---|---|---|---|---|
| 4,860,185 A | * | 8/1989 | Brewer et al. | 363/41 |
| 5,737,168 A | * | 4/1998 | Baker | 361/90 |
| 6,775,784 B1 | * | 8/2004 | Park | 713/320 |
| 2007/0096781 A1 | | 5/2007 | Ito | |
| 2008/0010474 A1 | * | 1/2008 | Chapuis | 713/300 |
| 2008/0048665 A1 | | 2/2008 | Burkland et al. | |
| 2010/0223485 A1 | * | 9/2010 | Zou | 713/340 |

FOREIGN PATENT DOCUMENTS

CN 2857298 Y 1/2007

OTHER PUBLICATIONS

English translation of abstract of CN 2857298(Y).

* cited by examiner

*Primary Examiner* — Mark Connolly
(74) *Attorney, Agent, or Firm* — Thomas, Kayden, Horstemeyer & Risley, LLP

(57) ABSTRACT

A power on control device and method are used at an adaptor providing a constant voltage. The power on control device includes a first voltage converting circuit, a second voltage converting circuit, a third voltage converting circuit, and a comparison module. The first voltage converting circuit receives the constant voltage and generates a reference voltage. The second voltage converting circuit receives the constant voltage and generates operating voltages. The third voltage converting circuit receives the operating voltages and generates preparatory voltages corresponding to the operating voltages according to the operating voltages. The comparison module outputs a power good signal when all the preparatory voltages are larger than the reference voltage.

9 Claims, 4 Drawing Sheets

POWER ON CONTROL DEVICE AND METHOD

CROSS-REFERENCES TO RELATED APPLICATIONS

This non-provisional application claims priority under 35 U.S.C. §119(a) on Patent Application No. 97132000 filed in Taiwan, R.O.C. on Aug. 21, 2008, the entire contents of which are hereby incorporated by reference.

BACKGROUND OF THE INVENTION

1. Technical Field

The invention relates to a power on control device and method and, more particularly, to a power on control device and method used at an adaptor providing a constant voltage.

2. Related Art

When a computer system is just booted, it generates an appropriate direct current (DC) voltage. A power source needs to be turned on for a short period of time, and then it can be provided to internal components and peripheral components of the computer system to use to make a computer normally operate. If a user provides the power source to the computer to use or tries to boot the computer before the power source of the computer system is stable, it results in a phenomenon that the computer system has an error and is unable to normally operate. The reason for the occurrence of the phenomenon is that the power source does not reach an appropriate voltage. As a result, to avoid booting the computer system too early, the power supply provides a signal to a motherboard. The signal is a power good signal. In other words, when internal tests on the power source of the computer system is completed and the power source is determined to be ready to be used, the power good signal is transmitted to inform the motherboard that the computer system can be booted.

However, when the computer system utilizes an adaptor to provide the power source, the adaptor only provides a constant voltage to the computer system. Consequently, when the computer system supplies power via the adaptor, the adaptor cannot directly generate the power good signal to the computer system. As a result, the computer system cannot know that whether the power source is ready or not, which causes that the computer system cannot normally operate.

These and other features, aspects and advantages of the present invention will become better understood with regard to the following description, appended claims, and accompanying drawings.

SUMMARY

One objective of the invention provides a power on control device and method to improve disadvantages of conventional technology.

The invention provides a power on control device. The power on control device is used at an adaptor providing a constant voltage. The power on control device includes a first voltage converting circuit, a second voltage converting circuit, a third voltage converting circuit, and a comparison module. The first voltage converting circuit receives the constant voltage and generates a reference voltage. The second voltage converting circuit receives the constant voltage and generates operating voltages. The third voltage converting circuit receives the operating voltages and generates preparatory voltages according to the operating voltages. The comparison module outputs a power good signal when all the preparatory voltages are larger than the reference voltage.

The invention also provides a power on control method. The power on control method is used at an adaptor providing a constant voltage. The power on control method includes the following steps. First, a constant voltage is received and a reference voltage is generated. Second, the constant voltage is received and operating voltages are generated. Third, the operating voltages are received, and corresponding preparatory voltages are generated according to the operating voltages. Forth, when all the preparatory voltages are larger than the reference voltage, the power good signal is outputted.

Via the device and the method provided by the invention, the computer having an adaptor and providing a constant voltage can generate a power good signal lacked in the conventional technology when the power source is ready to be used. Thus, the computer can be booted smoothly.

These and other features, aspects and advantages of the present invention will become better understood with regard to the following description, appended claims, and accompanying drawings.

DETAILED DESCRIPTION

Figure 1A:
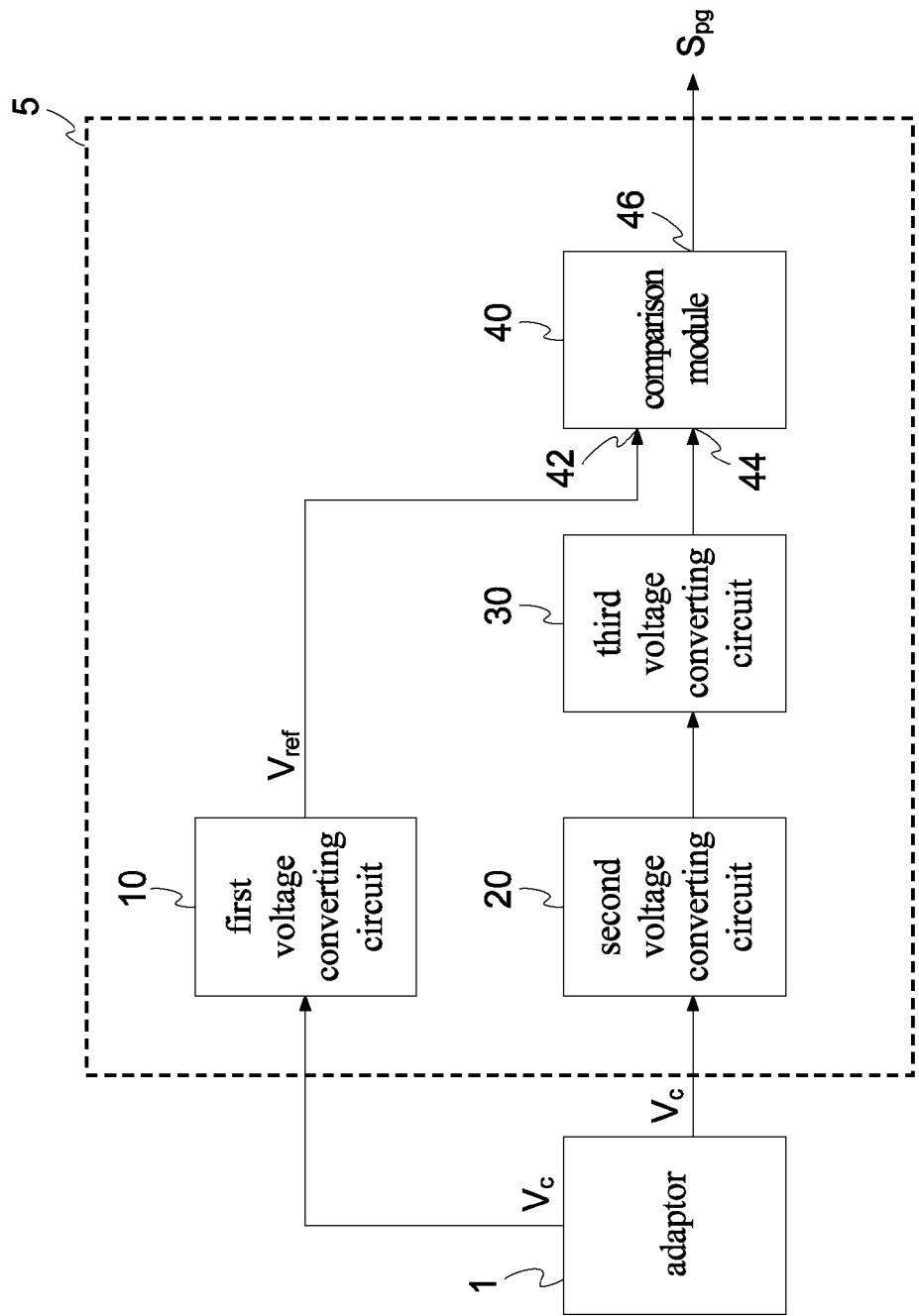
FIG. 1A is a schematic diagram showing a power on control device according to an embodiment of the invention.
Figure 1B:
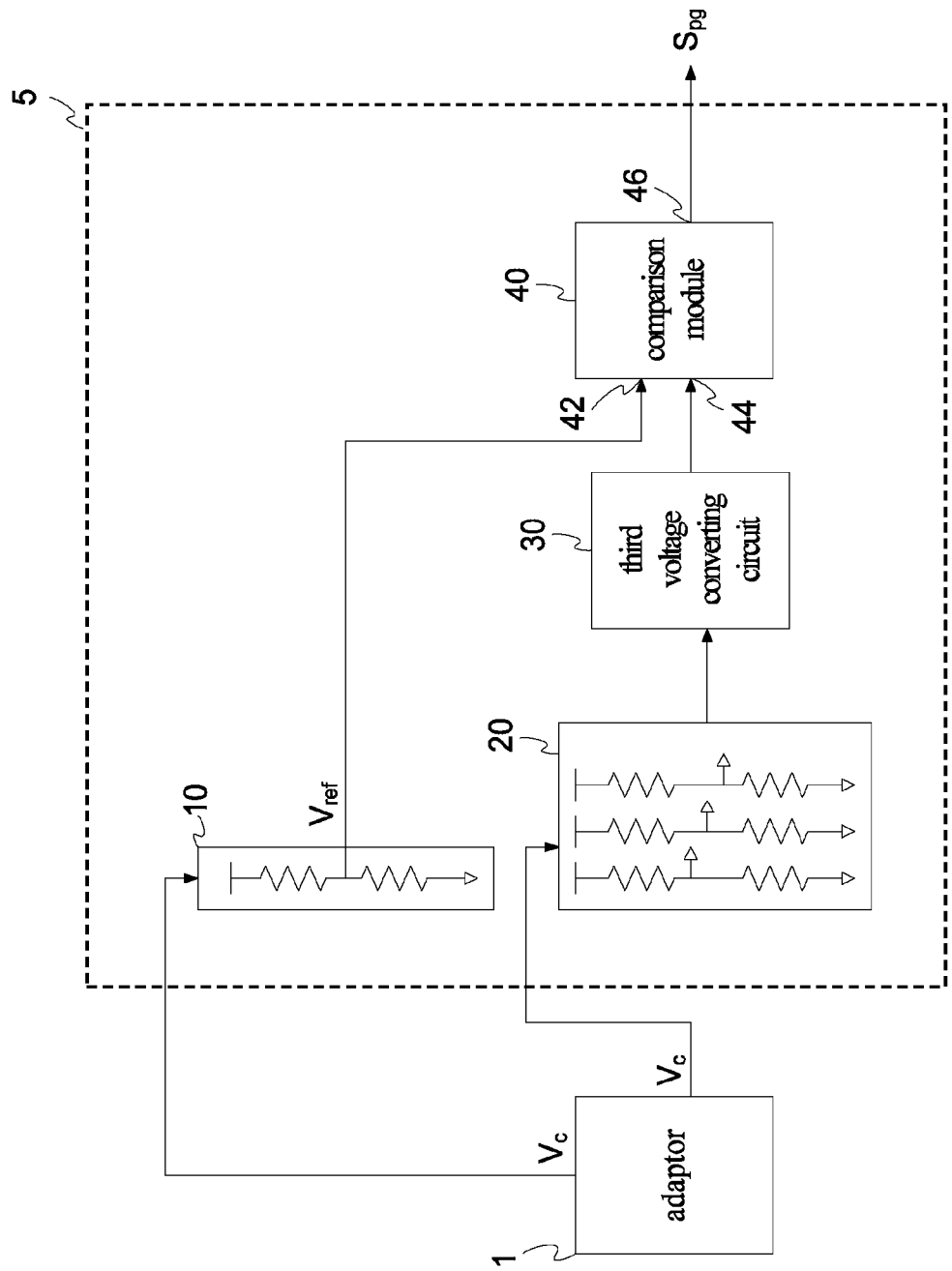
FIG. 1B is a schematic diagram showing a power on control device according to another embodiment of the invention.

FIG. 1A and FIG. 1B are schematic diagrams showing power on control devices according to two embodiments of the invention. The power on control device according to the invention is used in an adaptor capable of providing a constant voltage, and the adaptor can be coupled with a computer system to provide a power source the computer system needs. A power on control device 5 includes a first voltage converting circuit 10, a second voltage converting circuit 20, a third voltage converting circuit 30, and a comparison module 40. A constant voltage $V_c$ provided by an adaptor 1 may be, but not limited to, 19V here.

The first voltage converting circuit 10 generates a reference voltage $V_{ref}$ according to the constant voltage $V_c$ provided by the adaptor 1. In FIG. 1B, the first voltage converting circuit 10 may be a voltage dividing circuit which generates a reference voltage in a voltage dividing mode. The voltage value of the reference voltage can be set according to the demand.

Since the computer system needs power sources with different voltage values to be provided to different components to use. Consequently, the second voltage converting circuit 20 receives the constant voltage $V_c$ provided by the adaptor 1 and converts the constant voltage with a single voltage value to operating voltages with different voltage values. In FIG. 1B, the second voltage converting circuit 20 may be a voltage reduction circuit which converts the constant voltage $V_c$ to the operating voltages in a voltage reduction mode. For example, the second voltage converting circuit 20 receives the constant voltage $V_c$ and converts a 19V constant voltage to the operating voltages to be provided to the computer system to use. The operating voltages are, but not limited to, 3V, 5V, and 12V.

The third voltage converting circuit 30 receives the operating voltages generated by the second voltage converting circuit 20, respectively, and it generates preparatory voltages according to the operating voltages. In FIG. 1B, the third voltage converting circuit 30 may be the voltage dividing circuit which generates the preparatory voltages in the voltage dividing mode. For example, when the power source of the computer system is just booted, since the operating voltages of the power source just begin to rise, the power source is not ready yet. When the value of every operating voltage is up to 90 percent of the maximum voltage value, it represents that the power source reaches a voltage rating and it is ready to be provided to the computer system to use. At the time, the power good signal can be transmitted. As a result, the invention utilizes the third voltage converting circuit 30 to receive the operating voltages, and it utilizes the voltage dividing circuit to realize that it represents that the operating voltage is ready and can be provided to the computer system to use when the value of the operating voltage reaches a voltage rating, but not limited to, 90 percent of. the maximum voltage value The comparison module 40 has a negative input end 42, a positive input end 44, and an output end 46. The negative input end 42 receives the reference voltage. The positive input end 44 receives the preparatory voltage. When the comparison module 40 compares the reference voltage and the preparatory voltage, and the result is that the preparatory voltage is larger than the reference voltage, the output end 46 outputs a high level signal which is a power good signal $S_{pg}$.

One of the operating voltages is taken as an example to explain herein. The operating voltage is supposed to be 5V, a dividing ratio of the third voltage converting circuit 30 is supposed to be two-thirds, and then the preparatory voltage is supposed to be 3V (5V*90%*⅔). Thus, the reference voltage is supposed to be set to be 2.95V in this embodiment. When the power source is just started, the operating voltage does not reach 5V immediately. The operating voltage rises for a period of time to reach a 5V voltage rating. At the time, the third voltage converting circuit 30 receives the operating voltage just started, and the preparatory voltage generated by the third voltage converting circuit 30 according to the operating voltage is smaller than 2.95V Via a comparison performed by the comparison module 40, a signal generated by the output end 46 is a low level signal, and thus the power good signal is not generated. When the operating voltage gradually rises to make the operating voltage generated by the third voltage converting circuit 30 reach 90 percent of the maximum voltage value which is the voltage rating 4.5V, it represents that the preparation of the 5V operating voltage is completed. At the time, the preparatory voltage generated after a voltage division performed by the third voltage converting circuit 30 is 3V Via the comparison performed by the comparison module 40, the preparatory voltage of the positive input end 44 is 3V, the reference voltage of the negative input end 42 is 2.95V, and the output end 46 outputs the high level signal, that is, the output end 46 outputs the power good signal to allow the computer system to known that the preparation of the 5V operating voltage is completed. Since the operating voltages of a common computer have different voltage values, different states of the voltage division can be designed to allow all the generated preparatory voltages to be about 3V and large than the reference voltage set to be 2.95V before the operating voltage reaches the voltage rating. Then, a simple logic gate such as an AND gate is utilized. Thus, the power good signal may not be transmitted until the preparations of all operating voltages are completed.

Figure 2:
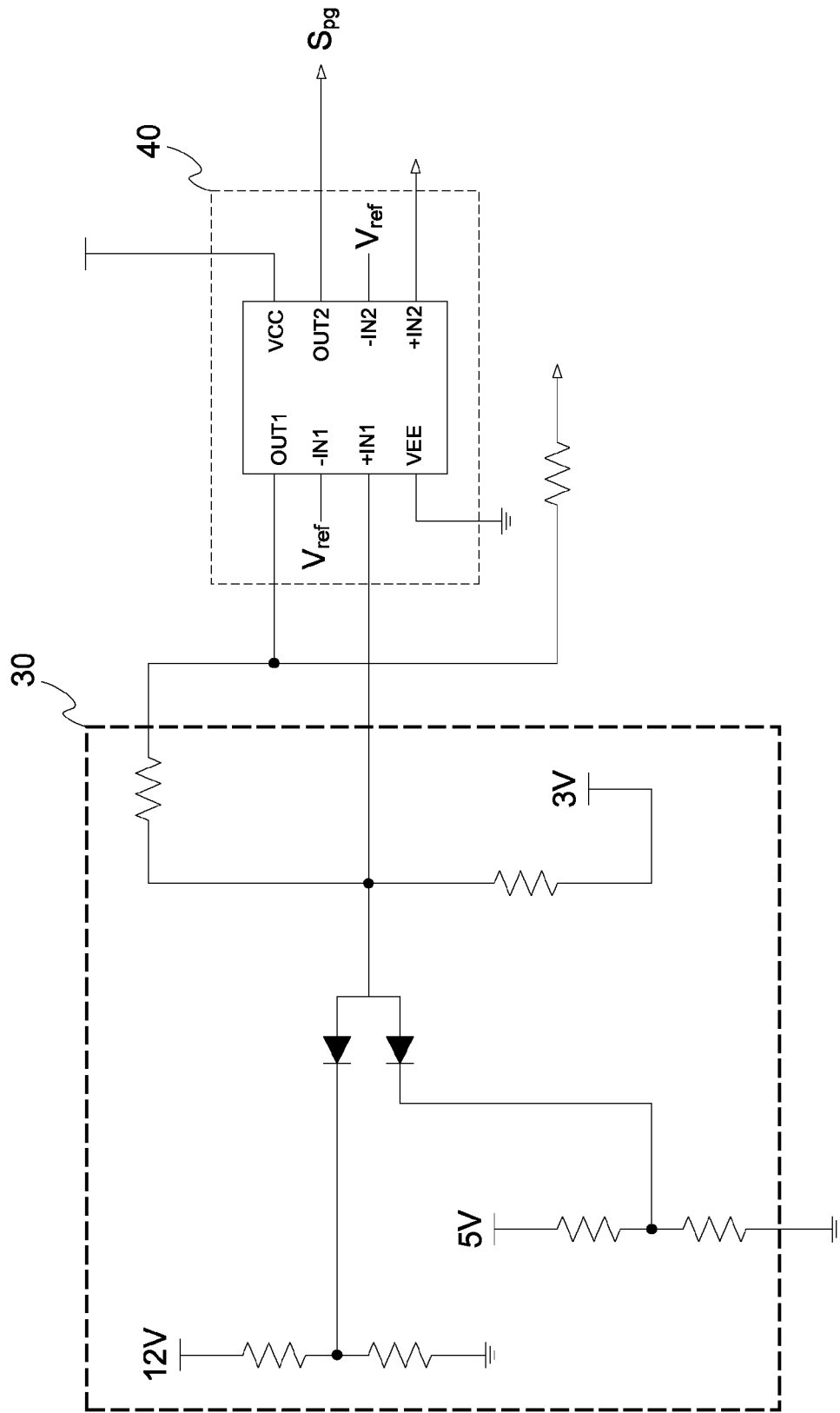
FIG. 2 is a schematic diagram showing a circuit of a third voltage converting circuit and a comparison module according to an embodiment of the invention.

FIG. 2 is a schematic diagram showing a circuit of a third voltage converting circuit and a comparison module according to an embodiment of the invention. In this embodiment, the coupling relationship between the third voltage converting circuit 30 and the comparison module 40 is taken as an example to describe here. In FIG. 2, the voltage division performed to the operating voltages including 3V, 5V, and 12V in the third voltage converting circuit 30 is realized via resistors to generate the preparatory voltages corresponding to the operating voltages, respectively. The comparison module 40 includes comparators. As a result, the comparison module 40 can be integrated to an integrated circuit (IC), and the IC has pins. For example, a +IN1 pin is coupled with the preparatory voltage generated by the third voltage converting circuit 30. A −IN1 pin and a −IN2 pin are used for coupling with the reference voltage $V_{ref}$. An OUT2 pin is used for outputting the power good signal $S_{pg}$ and so on.

Figure 3:
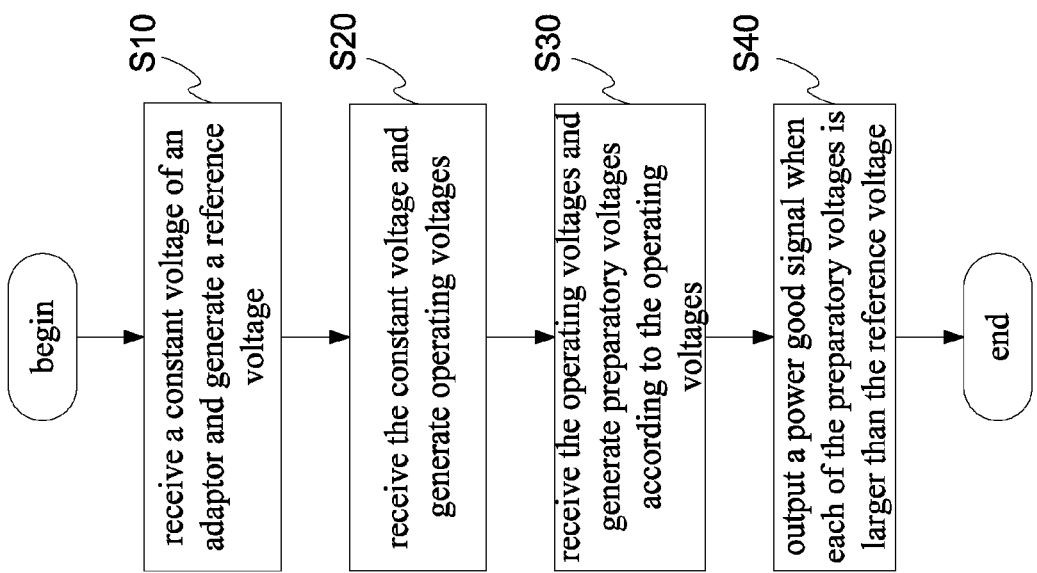
FIG. 3 is a flow chart showing a power on control method according to an embodiment of the invention.

FIG. 3 is a flow chart showing a power on control method according to an embodiment of the invention. The power on control method is used in an adaptor providing a constant voltage. The power on control method includes the following steps. The constant voltage may be 19V.

In step S10, the constant voltage is received, and the reference voltage is generated. The reference voltage may be generated utilizing the voltage dividing mode.

In step S20, the constant voltage is received, and the operating voltages are generated. The operating voltages may be generated utilizing the voltage reduction mode. The operating voltages may be chosen from a group including 3V, 5V, and 12V.

In step S30, the operating voltages are received and the preparatory voltages are generated according to the operating voltages. Preparatory voltages may be generated utilizing the voltage dividing mode.

In step S40, the power good signal is outputted when all the preparatory voltages are larger than the reference voltage.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A power on control device, wherein the power on control device is connected with an adaptor providing a constant voltage, the power on control device comprising:
    a first voltage converting circuit receiving the constant voltage and generating a reference voltage;
    a second voltage converting circuit receiving the constant voltage and generating a plurality of operating voltages;
    a third voltage converting circuit receiving the operating voltages and generating a plurality of preparatory voltages correspondingly according to the operating voltages; and
    a comparison module outputting a power good signal when all the preparatory voltages are larger than the reference voltage.

2. The power on control device according to claim 1, wherein the comparison module has comparators, each of the comparators has a negative input end, a positive input end, and an output end, the negative input end receives the reference voltage, the positive input end receives either one of the preparatory voltages, and the output end is used for outputting the power good signal.

3. The power on control device according to claim 1, wherein the first voltage converting circuit is a voltage dividing circuit.

4. The power on control device according to claim 1, wherein the second voltage converting circuit is a voltage reduction circuit which reduces the constant voltage to generate the operating voltages.

5. The power on control device according to claim 1, wherein the third voltage converting circuit is a voltage dividing circuit, and the third voltage converting circuit receives the operating voltages and generates the corresponding preparatory voltages.

6. A power on control method, comprising:
   receiving a constant voltage of an adaptor and generating a reference voltage;
   receiving the constant voltage and generating operating voltages;
   receiving the operating voltages and generating preparatory voltages correspondingly according to the operating voltages; and
   outputting a power good signal when all the preparatory voltages are larger than the reference voltage.

7. The power on control method according to claim 6, wherein the step of generating the reference voltage is performed in a voltage dividing mode.

8. The power on control method according to claim 6, wherein the step of generating the preparatory voltages is performed in a voltage reduction mode.

9. The power on control method according to claim 6, wherein the step of generating the preparatory voltages is performed in a voltage dividing mode.

* * * * *